United States Patent
Hong (10) Patent No.: US 10,658,944 B2
(45) Date of Patent: May 19, 2020

(54) AC/DC COMBINED POWER CONVERTING APPARATUS AND HOME APPLIANCE INCLUDING THE SAME

(71) Applicant: LG ELECTRONICS INC., Seoul (KR)

(72) Inventor: Youngho Hong, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/375,625

(22) Filed: Apr. 4, 2019

(65) Prior Publication Data

US 2019/0312523 A1   Oct. 10, 2019

(30) Foreign Application Priority Data

Apr. 5, 2018 (KR) .................. 10-2018-0039753

(51) Int. Cl.

| | |
|---|---|
| *H02M 7/219* | (2006.01) |
| *G01R 19/165* | (2006.01) |
| *H02M 1/44* | (2007.01) |
| *H02P 27/06* | (2006.01) |
| *H02J 5/00* | (2016.01) |
| *H02J 4/00* | (2006.01) |
| *H02M 1/00* | (2006.01) |

(52) U.S. Cl.
CPC .......... *H02M 7/219* (2013.01); *G01R 19/165* (2013.01); *H02J 4/00* (2013.01); *H02J 5/00* (2013.01); *H02M 1/44* (2013.01); *H02P 27/06* (2013.01); *H02M 2001/0003* (2013.01)

(58) Field of Classification Search
CPC .... H02M 5/40–48; H02M 7/219; H02M 1/44; H02M 2001/0003; H02P 27/06; G01R 19/165
See application file for complete search history.

(56) References Cited

U.S. PATENT DOCUMENTS

| | | | |
|---|---|---|---|
| 9,438,101 B1 | 9/2016 | Flynn et al. | |
| 2015/0076914 A1* | 3/2015 | Tsai .................. | H02J 9/06 307/66 |
| 2015/0192346 A1* | 7/2015 | Lee ................... | F25D 21/006 62/129 |

(Continued)

FOREIGN PATENT DOCUMENTS

| | | |
|---|---|---|
| JP | 07222435 A | 8/1995 |
| JP | 2018028995 A | 2/2018 |

(Continued)

*Primary Examiner* — Yusef A Ahmed
*Assistant Examiner* — Shahzeb K Ahmad
(74) *Attorney, Agent, or Firm* — Dentons US LLP (57) ABSTRACT

A power converting apparatus and a home appliance having the same according to the present invention includes: an input unit including an AC connection unit which receives an alternating current (AC) power from an external and a DC connection unit which receives a direct current (DC) power; a DC terminal voltage detection unit which detects a voltage of a DC terminal; a heater which is driven based on a voltage of the DC terminal; and a heater power supply unit supplies a voltage having a different magnitude to the heater according to a voltage detected by the DC terminal voltage detection unit, so that the home appliance and the heater can be commonly used for both the DC power and the AC power.

16 Claims, 9 Drawing Sheets

(56) References Cited

U.S. PATENT DOCUMENTS

| | | | |
|---|---|---|---|
| 2015/0359040 A1* | 12/2015 | Yamamoto | H05B 1/0241 |
| | | | 219/216 |
| 2016/0056634 A1* | 2/2016 | Choi | H02J 5/00 |
| | | | 307/64 |
| 2016/0336792 A1* | 11/2016 | Terazono | H01M 10/48 |
| 2018/0183317 A1* | 6/2018 | Nakahara | H02J 3/32 |
| 2018/0277993 A1* | 9/2018 | Pan | H01R 13/635 |

FOREIGN PATENT DOCUMENTS

| | | | |
|---|---|---|---|
| KR | 1020000008828 A | | 2/2000 |
| KR | 1020130078964 A | | 7/2013 |
| KR | 20180011514 | * | 2/2018 |
| KR | 1020180011514 A | | 2/2018 |

* cited by examiner

| Input current | Resistance | Current | W |
|---|---|---|---|
| 220 | 206 | 0.94 | 235 |
| 220 | 421 | 1.91 | 115 |

(b)

| Input current | Resistance | Current | W |
|---|---|---|---|
| 380 | 206 | 1.84 | 701.0 |
| 380 | 421 | 0.90 | 343.0 |

AC/DC COMBINED POWER CONVERTING APPARATUS AND HOME APPLIANCE INCLUDING THE SAME

CROSS-REFERENCE TO RELATED APPLICATION

This application claims the priority benefit of Korean Patent Application No. 10-2018-0039753, filed on Apr. 5, 2018, the disclosure of which is incorporated herein by reference.

BACKGROUND OF THE INVENTION

1. Field of the Invention

The present invention relates to a power converting apparatus and a home appliance having the same, and more particularly, to an AC/DC combined power converting apparatus and a home appliance having the same.

2. Description of the Related Art

The power converting apparatus is an apparatus that converts input power and supplies converted power. Such a power converting apparatus is disposed in a home appliance, and converts the input power to a power for driving the home appliance.

For example, a power converting apparatus using AC power converts received AC power into DC power for driving a home appliance, and a power converting apparatus using DC power converts received DC power to driving power of various voltage levels so as to drive the home appliance.

Figure 1:
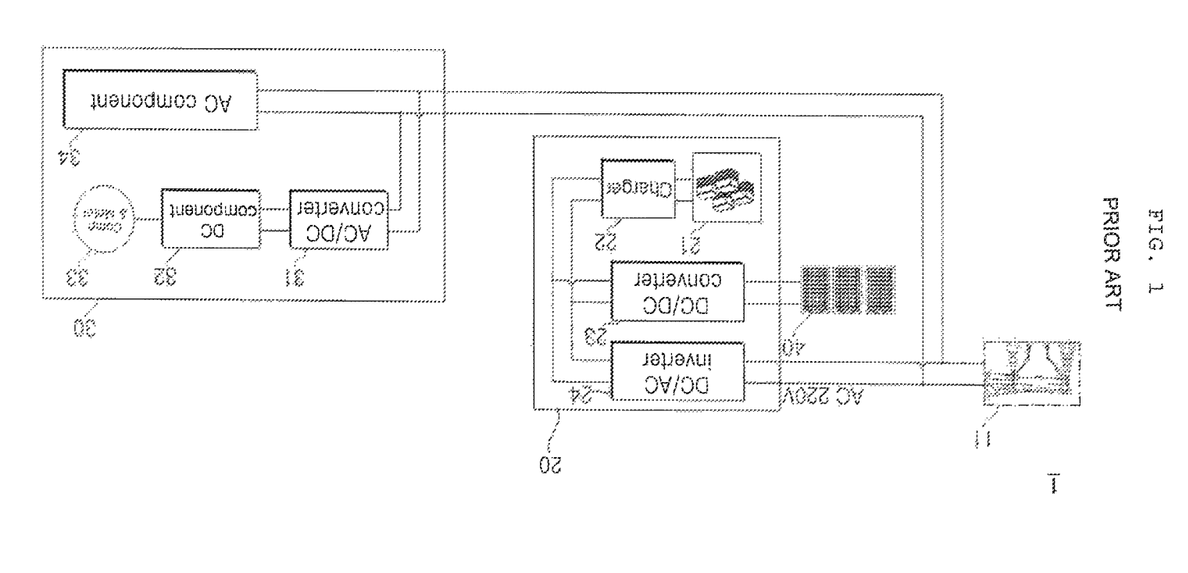
FIG. 1 is a diagram illustrating an example of a configuration of an AC-based power supply system.

FIG. 1 is a diagram illustrating an example of a configuration of an AC-based power supply system.

Referring to FIG. 1, an AC-based power supply system 1 includes a home appliance 30 that receives an AC power from the outside and operates based on an AC power, and an energy storage apparatus 20 that stores DC power generated based on AC power received from the outside or generated based on new and renewable energy.

The power supply system 1 may include a power generation apparatus based on new and renewable energy such as a solar module 40 that includes a solar cell and generates and outputs a DC power based on the solar cell.

The energy storage apparatus 20 may include at least one battery 21 and may store electric power in the battery 21 through a charger 22.

In addition, the energy storage apparatus 20 may be provided with a DC/DC converter 23 to convert into a voltage level for charging the battery 21.

Meanwhile, the energy storage apparatus 20 may supply the power generated in the solar module 40 or stored in the battery 21 to the outside. To this end, the energy storage apparatus 20 may include a DC/AC inverter 24.

Meanwhile, the battery 21 may store power based on the AC power received from the outside. In this case, the energy storage apparatus 20 may have a bi-directional converter (not shown) instead of the DC/AC inverter 24.

The AC power may be supplied from a commercial power plant 11 to the home energy storage apparatus 20, the home appliance 30, and the like.

The home appliance 30 requires an AC/DC converter 31 so as to use a DC component 32 such as an inverter designed to use DC power.

For example, the AC power received from the home appliance 30 is converted to DC power by the AC/DC converter 31, and drives the motor 33 through the inverter 32.

In some cases, an AC component 34 such as a heater, a valve, a door switch, or the like manufactured to use AC power may operate by using AC power.

Recently, as there are problems such as the deterioration in efficiency due to AC/DC conversion, the increase in components and manufacturing cost for power conversion, and the high frequency noise due to AC power, and as the DC-based distributed generation increases, the research on DC-based power supply is increased.

Figure 2:
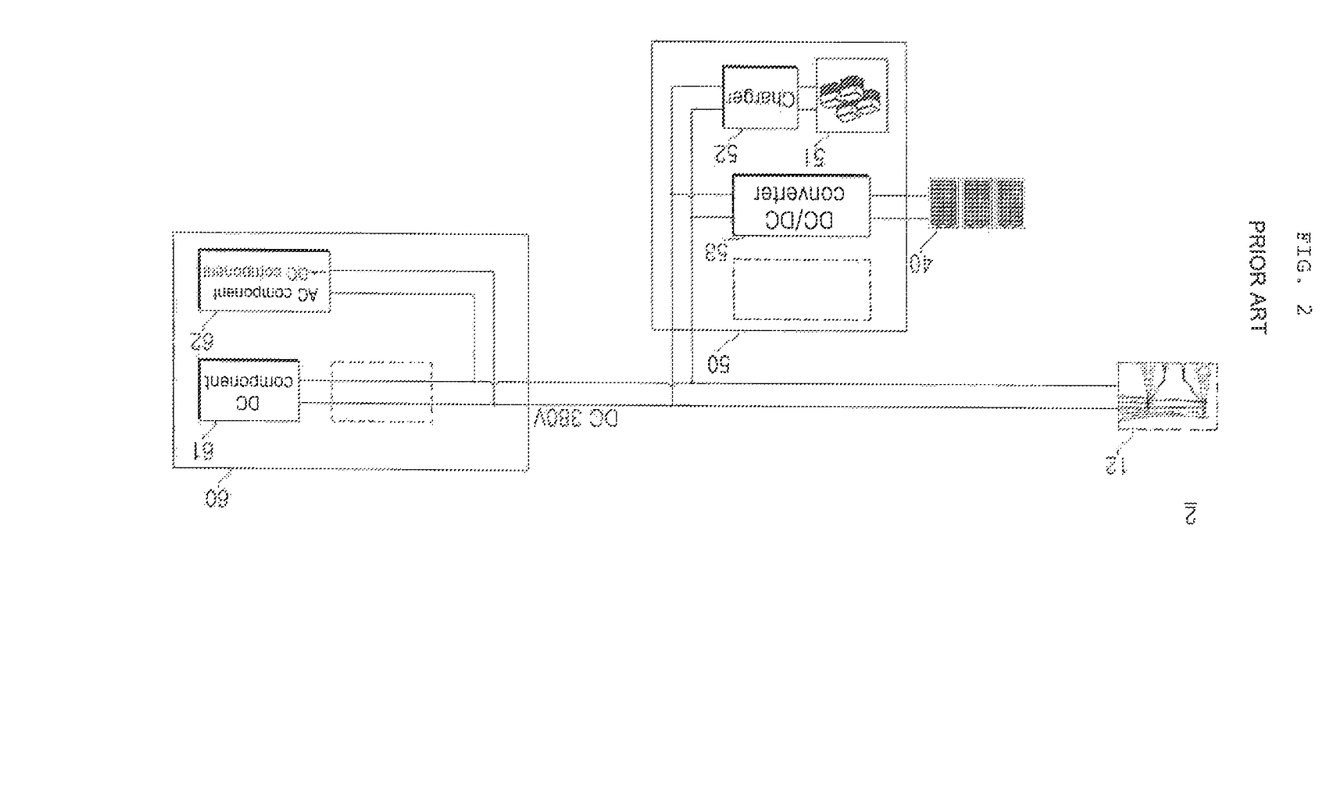
FIG. 2 is a diagram illustrating an example of a configuration of a DC-based power supply system.

FIG. 2 is a diagram illustrating an example of a configuration of a DC-based power supply system.

Referring to FIG. 2, a DC-based power supply system 2 includes a home appliance 60 that receives DC power from the outside and operates based on DC power, and an energy storage apparatus 50 that stores DC power generated based on AC power received from the outside or generated based on new and renewable energy.

The energy storage apparatus 50 may include at least one battery 51 and may store power in the battery 51 through a charger 52.

Further, the energy storage apparatus 50 may include a DC/DC converter 53 to convert into a voltage level for charging the battery 51.

Meanwhile, the energy storage apparatus 50 can supply the power generated in the solar module 40 or stored in the battery 51 to the outside without the DC/AC inverter 24 or a bidirectional converter.

When DC power is supplied from a commercial power plant 12, the home appliance 60 receives the DC power, not the AC power, and can directly drive the internal constituent units. Accordingly, high-frequency noise or the like due to the AC power does not occur. Furthermore, since the converter 31, and the like is not required, the manufacturing cost is reduced. In addition, it is also possible to configure the system by using only a DC component 61, 62.

Meanwhile, as the spread of new and renewable energy including solar-light power generation is activated, and as the effort to save energy and improve energy efficiency is increased, the demand for DC appliances connected to DC distribution is increasing.

For example, related art 1 (Korean Patent Laid-Open Publication No. 10-2011-0097254 (published on Aug. 31, 2011) discloses a power supply network using a DC source and an electric appliance based thereon.

Related art 1 aims at reducing energy consumption by reducing loss due to inverter or the like, by installing a large capacity AC/DC converter in a building entrance and inputting DC power to home appliances.

However, related art 1 relates to a DC-dedicated household appliance and is difficult to use in an existing AC distribution environment.

The inability to use DC-dedicated household appliance in an AC distribution environment increases the cost of converting and makes many governments to hesitate about rapid transition to DC distribution having many advantages.

In addition, it also makes individual users to hesitate to purchase DC-dedicated household appliances that can not be used in the AC distribution environment.

In addition, in a case where the environment is not a DC-based power supply environment, a separate converter must be provided outside the household appliance. Providing a separate converter increases manufacturing cost and service cost.

In addition, it is difficult for unskilled users to install and use electrical products, and there is a risk of safety accidents.

Therefore, an AC/DC combined home appliance is required. The AC/DC combined home appliance has the advantage of being freely used in the AC distribution environment and the DC distribution environment.

In addition, the AC/DC combined home appliance has the effect of accelerating the transition to DC distribution, since customers can purchase home appliances without worrying about whether they will continue to use the AC appliances or replace them with DC appliances in the transition period to DC distribution.

In addition, in order to implement the AC/DC combined home appliance, it is required for an internal component such as a heater to be commonly used regardless of a power source.

In addition, there is a need for an AC/DC combined home appliance capable of improving stability by preventing arcs that may occur when DC power source is used, with low cost.

In addition, there is a need for an AC/DC combined home appliance that is not difficult for non-skilled users to install and use.

SUMMARY OF THE INVENTION

The present invention has been made in view of the above problems, and provides a power converting apparatus and a home appliance including the power converting apparatus that supplies a voltage having a different magnitude to a heater according to a condition so that the heater can be used for both DC and AC.

In accordance with an aspect of the present invention, a power converting apparatus includes: an input unit including an AC connection unit which receives an alternating current (AC) power from an external and a DC connection unit which receives a direct current (DC) power; a bridge diode unit which is composed of a plurality of diodes and connected to the input unit; a capacitor which is connected to a DC terminal which is an output terminal of the bridge diode unit; a DC terminal voltage detection unit which detects a voltage of the DC terminal; a heater which is driven based on the voltage of the DC terminal; and a heater power supply unit which is disposed between the capacitor and the heater, and supplies a voltage having a different magnitude to the heater according to a voltage detected by the DC terminal voltage detection unit.

The heater power supply unit includes: a DC/DC converter which converts the voltage of the DC terminal and outputs the converted voltage to the heater; and a relay unit which operates to supply the DC terminal voltage to the heater or the DC/DC converter, according to the voltage detected by the DC terminal voltage detection unit.

The DC/DC converter reduces and outputs an input voltage.

The relay unit operates to supply a first voltage to the heater when the voltage detected by the DC terminal voltage detection unit is the first voltage, and supply a second voltage to the DC/DC converter when the voltage detected by the DC terminal voltage detection unit is the second voltage higher than the first voltage.

The heater has a maximum efficiency with the first voltage.

The relay unit includes: an input terminal to which the voltage of the DC terminal is applied; a first output terminal which is connected to the DC/DC converter; and a second output terminal which is connected to the heater.

The bridge diode unit is operated in such a manner that the other diode of a plurality of diodes is turned on according to a polarity of the DC power received in the input unit.

The bridge diode unit converts the AC power received through the AC connection unit to a DC power, and outputs the DC power to the DC terminal.

The power converting apparatus further includes a noise filter disposed between the input unit and the bridge diode unit.

The AC connection unit is connected to an AC plug and the DC connection unit is connected to a DC plug, and the DC plug includes an arc extinction device.

The input unit includes: an AC input detection unit which senses an input of the AC power; and a DC input detection unit which senses an input of the DC power, a relay which block a connection between the AC connection unit and the bridge diode unit when the DC input detection unit detects the input of the DC power.

BRIEF DESCRIPTION OF THE DRAWINGS

The objects, features and advantages of the present invention will be more apparent from the following detailed description in conjunction with the accompanying drawings, in which.

DETAILED DESCRIPTION OF THE PREFERRED EMBODIMENTS

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated. With respect to constituent elements used in the following description, suffixes "module" and "unit" are given only in consideration of ease in the preparation of the specification, and do not have or serve as specially important meanings or roles. Thus, the "module" and "unit" may be mingled with each other. It will be understood that although the terms first, second, etc. may be used herein to describe various elements, these elements should not be limited by these terms. These terms are only used to distinguish one element from another. A singular representation may include a plural representation unless context clearly indicates otherwise. Terms such as "includes" or "has" used herein should be considered as indicating the presence of several components, functions or steps, disclosed in the specification, and it is also understood that more or fewer components, functions, or steps may likewise be utilized.

Figure 3:
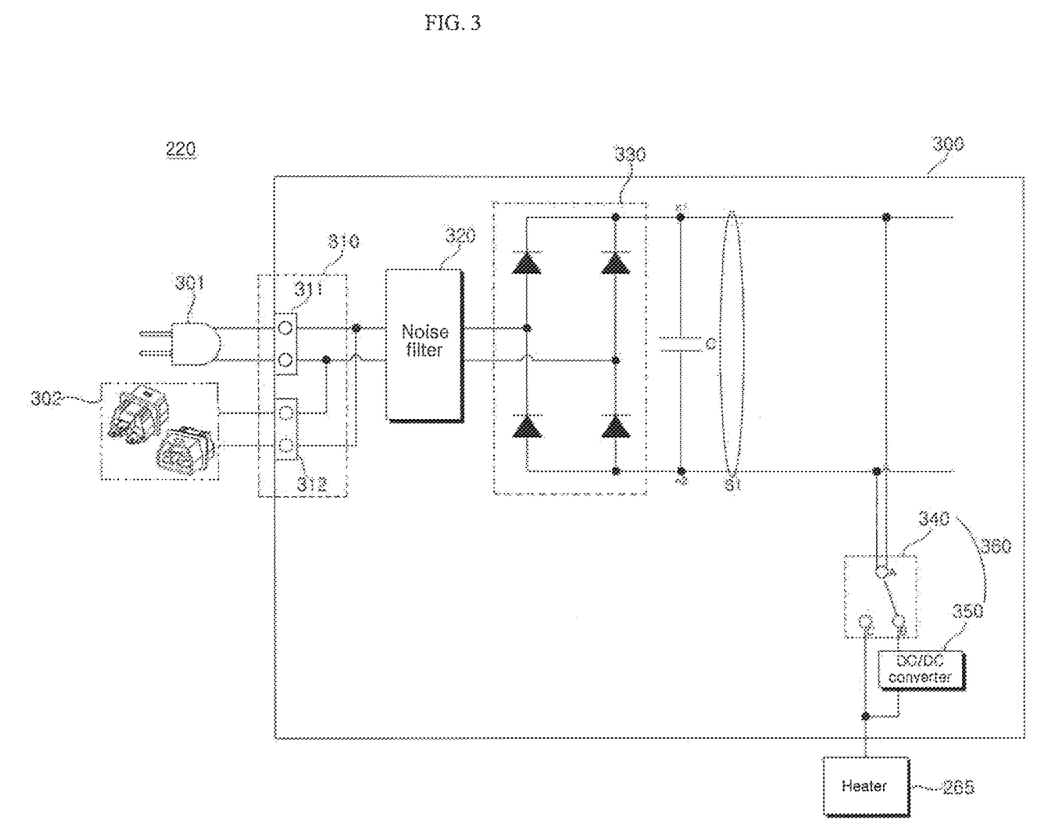
FIG. 3 is a schematic internal block diagram of a power converting apparatus according to an embodiment of the present invention.

FIG. 3 is a schematic internal block diagram of a power converting apparatus according to an embodiment of the present invention, and more particularly, is an example of a power supply unit 300.

Meanwhile, a power converting apparatus 220 described in this specification may be a power converting apparatus provided inside a home appliance.

The home appliance may be a refrigerator, a washing machine, a dryer, an air conditioner, a dehumidifier, a cooking apparatus, a cleaner, a lighting apparatus, an electric vehicle, a drone, a TV, a monitor, a mobile terminal, a wearable apparatus, a server, and the like.

The power converting apparatus 220 according to an embodiment of the present invention may include a common power supply unit 300 that can use both a DC power and an AC power.

Referring to FIG. 3, the power converting apparatus 220 according to an embodiment of the present invention may include an input unit 310 including an AC connection unit 311 which receives AC power from the outside and a DC connection unit 312 which receives DC power, a bridge diode unit 330 which is composed of a plurality of diodes and connected to the input unit 310, a capacitor C which is connected to a DC terminal (between n1 and n2 terminals) which is an output terminal of the bridge diode unit 330, a DC terminal voltage detection unit S1 which detects the voltage of the DC terminal, a heater 265 which is driven based on the voltage of the DC terminal, and a heater power supply unit 360 which is disposed between the capacitor C and the heater 265, and supplies a voltage having a different magnitude to the heater 265 according to a voltage detected by the DC terminal voltage detection unit S1.

The heater 265 may be provided with a heating element, and may generate heat as voltage is applied thereto. Simply, the heating element may be formed of a resistor.

Such a heater 265 may be used in various home appliances.

For example, the heater 265 may be provided for drying, boiling, and dehumidifying in a laundry treatment apparatus.

In addition, in a refrigerator, the heater 265 may be provided for defrosting, melting ice, or for a home bar.

The heater 265 may be installed in an outdoor unit of an air conditioner to remove ice from an outdoor heat exchanger, and may be installed in an indoor unit for heating.

Meanwhile, the amount of heat generated per unit time may vary depending on the magnitude of the voltage applied to the heater 265. The configuration and characteristics of the heater 265 may vary depending on the supplied voltage, e.g., the voltage of the commercial power.

When the input voltage is increased, the resistance value should be increased to implement the same heating value (same wattage).

The resistance value of the resistor included in the heater 265 may be adjusted so as to have a maximum efficiency in accordance with a driving voltage and a power consumption.

For example, the resistance value of the heater 265 may be set to a certain amount of electric power when the AC 220V voltage is applied, and the resistance value of the heater 265 may be set to a certain amount of electric power when the DC 380V voltage is applied.

Meanwhile, in this specification, it is illustrated by example that the AC voltage is 220V and the DC voltage is 380V, but the present invention is not limited thereto. The voltage value used may vary depending on the country or organization.

In the case of driving the heater 265 by using a relay, when the relay fails, a short may occur and the current may continue to be supplied to the heater 265 to continuously increase the temperature, and there is a possibility of a safety accident such as a fire. The heater 265 should satisfy the heat generation temperature standard set in consideration of such a danger.

Since the heater 265 is designed by matching the resistance of the heater 265 according to an input voltage based on safety standard for heat generation temperature, the common use can be achieved only when the input voltages are the same.

Figure 4:
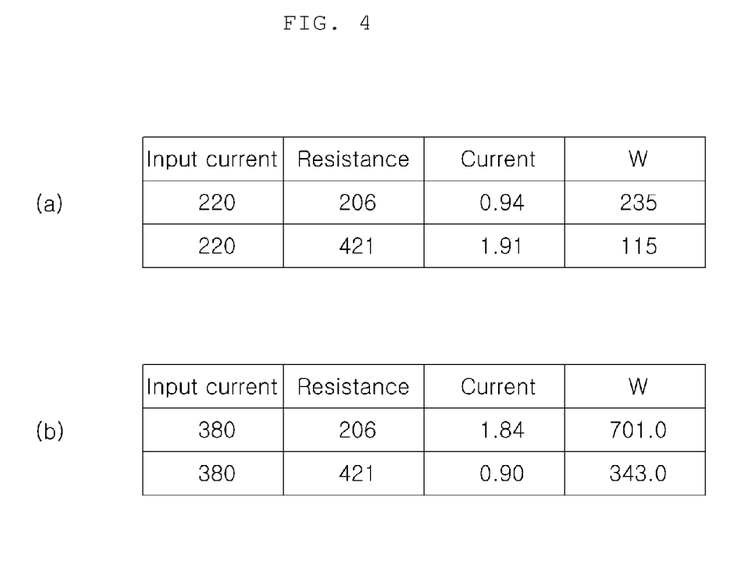
FIG. 4 is a diagram for explaining a heater characteristic according to an input voltage.

FIG. 4 is a diagram for explaining a heater characteristic according to an input voltage.

FIG. 4A shows an experimental measurement result of performing defrosting operation by using a resistance value of 206Ω, 421Ω, when the input voltage is AC 220V.

FIG. 4B shows an experimental measurement result of performing defrosting operation by using a resistance value of 206Ω, 421Ω, when the input voltage is 380V.

Comparing FIG. 4A and FIG. 4B, it can be seen that the wattage increases three times in the same resistance.

The heater surface temperature may be roughly calculated by the following equation, and a maximum heat generation temperature of about 630 degrees or more may be calculated when the input voltage is 380V.

Heater surface temperature=175.7+(167.4×heater power density)

Therefore, the temperature regulation below the heat generation temperature standard (e.g., 394 degrees) set for safety may not be satisfied.

Meanwhile, when the voltage of 380V is applied, the resistance value of the heater 265 may be designed to increase to adjust the wattage for the voltage increase. At this time, in the case of a specific heater such as a heater for home bar, a necessary resistance value may exceed a produce-able resistance value, and mass production may not be possible.

Therefore, it is necessary to commonly use the heater so that it can be used regardless of the input voltage. In addition, there is a need for a means capable of supplying a proper voltage so that the heater can be used in common, and a driving unit configured to be able to achieve a maximum efficiency with a fixed resistance value regardless of the input voltage is required.

Since the present invention is applicable to common use only when the input voltages are the same, the heater 265 can be commonly used for both DC and AC powers by supplying a voltage having a different magnitude to the heater 265 according to condition.

More specifically, the heater power supply unit 360 may supply a voltage having a different magnitude to the heater 265 according to the voltage detected by the DC terminal voltage detection unit S1, so that the home appliance and the heater can be commonly used for both DC and AC powers.

For example, when DC 360V is received, the heater power supply unit 360 may supply it directly to the heater 265. When DC 380V is received, the heater power supply unit 360 may adjust the voltage and supply it to the heater 265.

Referring to FIG. 3, the heater power supply unit 360 may include a DC/DC converter 350 which converts the voltage of the DC terminal and outputs the converted voltage to the heater 265, and a relay unit 340 which operates to supply the DC terminal voltage to the heater 265 or the DC/DC converter 350 according to the voltage detected by the DC terminal voltage detection unit S1.

The DC/DC converter 350 may reduce the input voltage and output it. For example, when DC 380V is received, the DC/DC converter 350 may reduce the voltage to 310V and output it.

The relay unit 340 may be operated to supply a first voltage to the heater 265 when the voltage detected by the DC terminal voltage detection unit S1 is the first voltage, and supply a second voltage to the DC/DC converter 350 when the voltage detected by the DC terminal voltage detection unit S1 is the second voltage higher than the first voltage.

For example, when the voltage detected by the DC terminal voltage detection unit S1 is 310V, the relay unit 340 may operate to supply 310V to the heater 265.

In addition, when the voltage detected by the DC terminal voltage detection unit S1 is 380V, the relay unit 340 may operate to supply 380V to the DC/DC converter 350.

When the DC 380V is inputted, the DC/DC converter 350 may operate to reduce the voltage and supply 310V to the heater 265.

Referring to FIG. 3, the relay unit 340 may include an input terminal A to which the voltage of DC terminal is applied, a first output terminal B connected to the DC/DC converter 350, and a second output terminal C connected to the heater 265.

When a relatively low voltage is applied to the relay unit 340, the relay unit 340 may connect the input terminal A and the second output terminal C to supply the voltage to the heater 265 directly.

In addition, when a relatively low voltage is applied to the relay unit 340, the relay unit 340 may connect the input terminal A and the first output terminal B, and operate to supply the voltage to the heater 265 after the DC/DC converter 350 reduces the voltage.

Meanwhile, the resistance value of the heater 265 may be designed to have a maximum efficiency at a first voltage which is a relatively low voltage. For example, the resistance of the heater 265 may be configured by calculating a required resistance value based on the case where the input voltage is DC 310V. Accordingly, a resistor having a relatively low resistance value may be used, and the heat generation temperature of the heater 265 may also be lowered.

In addition, the heater 265 may have the maximum efficiency when the magnitude of the DC terminal voltage is equal to the voltage generated by rectifying the AC power. For example, the resistance value of the heater 265 may be set based on DC 310V generated by rectifying the AC 220V by the bridge diode unit 330.

The bridge diode unit 330 may be composed of a plurality of diodes.

The bridge diode unit 330 may be composed of a diode or the like without a switching element, and may perform a rectifying operation without an additional switching operation when an AC power is input.

The bridge diode unit 330 may convert the AC power received through the AC connection unit 311 into DC power, and output the DC power to the DC terminal.

The bridge diode unit 330 may operate as a converter when AC power is input, and may rectify the AC power received by the input unit 310 and output the rectified power. The rectified power may be stored in a DC terminal capacitor C.

In the drawing, a single element is exemplified as the DC terminal capacitor C, but a plurality of elements may be provided to ensure the element stability.

Meanwhile, in both ends of the DC terminal capacitor C (between the terminals n1 and n2), the DC power may be stored, and may be referred to as a DC terminal or a DC link terminal.

In the bridge diode unit 330, when the DC is received, the other diode of the plurality of diodes may be turned on according to the polarity of the DC power received by the input unit 310, such that the bridge diode unit 330 may operate as a safety device.

Accordingly, DC power having polarity also can be safely used. Regardless of the polarity of the DC power which is connected by an unskilled user, the bridge diode unit 330 may have the same output, thereby enhancing both safety and convenience.

The bridge diode unit 330 may be removed from DC appliances using a DC power. However, the bridge diode unit 330 may not be removed to prevent a safety accident such as a fire due to a polarity change of a positive DC terminal or a negative DC terminal, and may form the common power supply unit 300.

The bridge diode unit 330 may serve as a safety apparatus for DC reverse connection, so that the power converting apparatus 220 can stably operate normally even if the DC polarity is changed.

When AC 220V is input, the DC terminal voltage may become DC 310V, and when DC 380V is input, the DC terminal voltage may become DC 310V.

When a difference in the input voltage occurs, the speed of a motor may be just only decreased or the efficiency may be just only degraded, but it is still possible to use the motor. However, the amount of heat generation of heater may vary depending on the input voltage, and, in the case of failure, the temperature of heat generation may increase suddenly or continuously, resulting in a safety accident such as a fire.

Therefore, the common use of heater may cause more difficult, and it is required to satisfy various standards for the safety problem.

According to the present invention, it is possible to commonly use the heater 265 without discriminating the heater 265 according to the voltage regardless of the voltage of the DC terminal voltage including 310V, 380V.

Meanwhile, the DC terminal voltage detection unit S1 may detect the voltage Vdc of the DC terminal which is both ends of the DC terminal capacitor C. To this end, the DC terminal voltage detection unit S1 may include a resistance element, an amplifier, and the like. The detected DC terminal voltage Vdc may be a discrete signal in a pulse form and may be input to a controller and/or a microcomputer (not shown) of the home appliance.

Meanwhile, the relay unit 340 may operate according to the DC terminal voltage detected by the DC terminal voltage detection unit S1.

For example, when the input voltage A of the relay unit 340 is DC 380V, the output of the relay unit 340 may be connected to the first output terminal B, may be reduced to 310V through the DC/DC converter 350, and then may be used as the driving voltage of the heater 265.

In the case of the input DC 310V, the output of the relay unit 340 may be connected to the second output terminal C, and the DC 310V may be directly used as the driving voltage of the heater 265.

Thus, the heater 265 may be commonly used without using a plurality of heaters, and an AC/DC combined home appliance may be provided.

The power converting apparatus 220 according to an embodiment of the present invention may further include a noise filter 320 for removing a noise component from an input power, and the noise filter 320 may be disposed between the input unit 310 and the bridge diode unit 330.

The input unit 310 may include an AC connection unit 311 for receiving the AC power from the outside and a DC connection unit 312 for receiving the DC power.

The AC connection unit 311 may be connected to an AC plug 301 and the DC connection unit 312 may be connected to a DC plug 302. The user may install and operate the home appliance by performing a simple operation of connecting the AC plug and/or the DC plug 302 to the input unit 310 and plugging it into an outlet.

According to an embodiment, the AC plug 301 and the DC plug 302 may be previously connected to the AC connection unit 311 and the DC connection unit 312, respectively, by the manufacturer. Preferably, one of the AC plug 301 and the DC plug 302 may be connected to a corresponding connection unit among the AC connection unit 311 and the DC connection unit 312.

In this case, user can install and operate the home appliance by a simple operation of plugging the AC plug 301 and/or the DC plug 302 into the outlet.

However, unlike the alternating current, in the case of the direct current, as the electric current flows uniformly, a zero crossing point of the current does not exist and the natural extinction cannot be performed, so that an arc may be generated at electric contact.

In particular, when a power plug having no DC arc discharge countermeasure device is opened, a counter electromotive force generated in a DC load may be induced in the plug, thereby causing a large arc.

Therefore, preferably, the DC plug may include an arc extinction device. For example, the DC plug may include at least one of an electrically operated extinction device that restricts the counter electromotive force that significantly increases the arc voltage, a magnetic extinction device that uses magnetic force, and an extinction device that uses a mechanical contact.

The power converting apparatus 220 according to an embodiment of the present invention may be configured to selectively input to the DC plug and the AC plug. In this case, the DC plug which is a power plug at the time of DC input may be equipped with an arc extinction device to prevent an occurrence of arc at the time of first connection and to prevent an occurrence of arc at the time of opening the plug due to a user error during operation.

Meanwhile, the power supply unit 300 may operate under the control of a controller (not shown) of the home appliance.

The controller of the home appliance may control the overall operation of the home appliance.

In addition, the controller of the home appliance may control the operation of the power converting apparatus 220. For example, the controller may output a corresponding speed command value signal to the power converting apparatus 220 based on a target value. Then, the power converting apparatus 220 may drive the motor, and the motor may be operated at a target rotation speed based on the speed command value signal.

In addition, the controller of the home appliance may control the operation of the power supply unit 300. For example, the controller may receive various data sensed in the power supply unit 300, and may control operation of switching element, relay, and the like based on the received data.

According to an embodiment, the power converting apparatus 220 may operate under the control of a certain microcomputer (not shown). The microcomputer may control switching element, relay, sensor, and the like of the power converting apparatus. For example, the microcomputer may control the turning on/off of switching element provided in the power supply unit or the like.

For example, the controller and/or the microcomputer of the home appliance may control operations of the relay unit 340 and the DC/DC converter 350.

Meanwhile, the microcomputer may generate a control signal for controlling one or more units provided in the home appliance, and may transmit the control signal to each unit. Alternatively, one or more microcomputers may be provided in the power converting apparatus 220.

Figure 5:
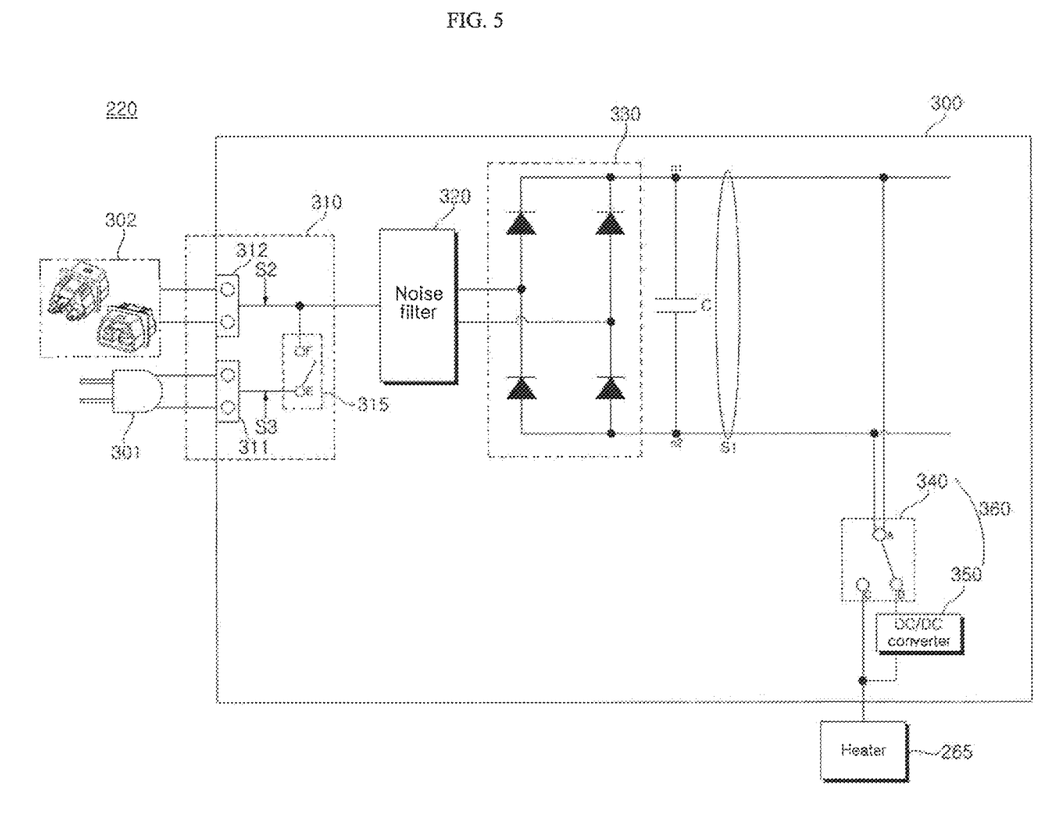
FIG. 5 is a schematic internal block diagram of a power converting apparatus according to an embodiment of the present invention.

FIG. 5 is a schematic internal block diagram of a power converting apparatus according to an embodiment of the present invention.

FIG. 5 is a schematic internal block diagram of a power converting apparatus according to an embodiment of the present invention, more specifically, is an example of the power supply unit 300.

The power supply unit 300 illustrated in FIG. 5 differs from the power supply unit 300 illustrated in FIG. 3 in that it further includes a relay 315, and the remaining portions are the same. Therefore, in the following description, the relay 315 will be mainly described to explain the difference.

The input unit 310 according to an embodiment of the present invention may further include the relay 315 for interrupting AC power received through the AC connection unit 311.

The input unit 310 may further include an AC input detection unit S3 for detecting the input of the AC power and a DC input detection unit S2 for detecting the input of the DC power. The AC input detection unit S3 and the DC input detection unit S2 may include a resistance element, an OP AMP, and the like for voltage detection.

When the DC input detection unit S2 detects the input of the DC power, the relay 315 may block the connection between the AC connection unit 311 and the bridge diode unit 330.

The relay 315 may operate to block the AC power when both the AC power and the DC power are received. Accordingly, a high-efficiency DC power may be preferentially used.

Further, the relay 315 may be operated to switch to the AC power supply when failure occurs in the DC power supply. For example, when a system failure occurs in a DC distribution system, it may be switched to the AC power supply. Thus, in case of the failure of the DC distributed power supply, it may be operated stably by switching to the AC power supply.

According to an embodiment, the relay 315 may be operated to switch to the DC power supply when failure occurs in the AC power supply.

According to an embodiment of the present invention, the DC plug 302 and the AC plug 301 can be selectively inputted.

In addition, the overlapped input of the AC power and the DC power may be prevented through the relay 315 that interrupts the AC power received through the AC connection unit 311.

The relay 315 may be provided as a safety apparatus, in the case of connecting both the DC plug 302 and the AC plug 301 due to misuse or for backup.

The input power may be detected through the AC input detection unit S2 for detecting the input of the AC power at the output terminal of the AC connection unit 311 and the DC input detection unit S1 for detecting the input of the DC power at the output terminal of the DC connection unit 312.

When the inputs of the AC power and the DC power are overlapped, the relay 315 may be opened (E-F open) so that only DC power having high efficiency can be inputted.

In addition, the relay 315 may maintain the turned-on state (E-F Short) in a normal state in which the AC power and the DC power are not overlapped.

Figure 6:
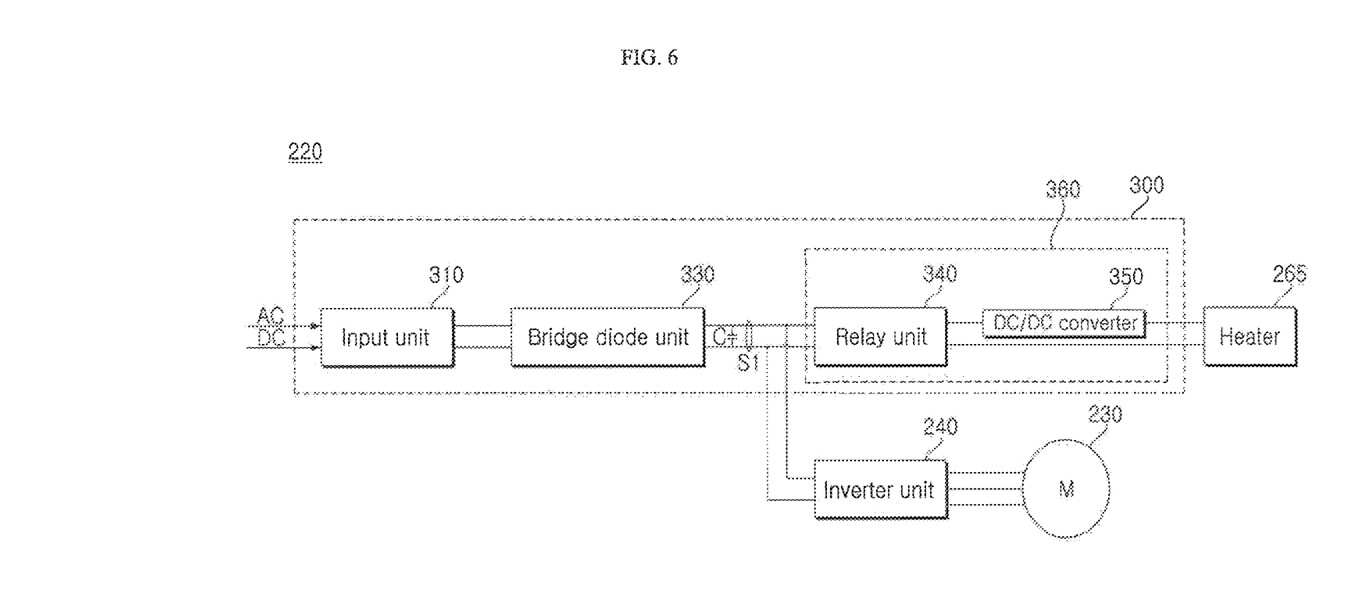
FIG. 6 is a simplified internal block diagram of a power converting apparatus according to an embodiment of the present invention.
Figure 7:
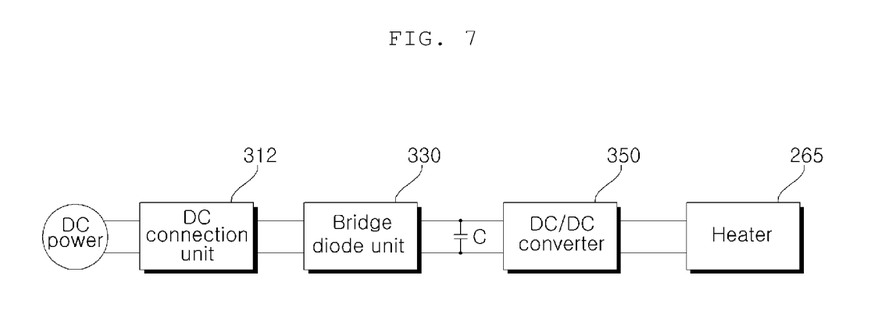
FIG. 7 and FIG. 8 are diagrams for explaining an operation of a power converting apparatus according to an embodiment of the present invention.
Figure 8:
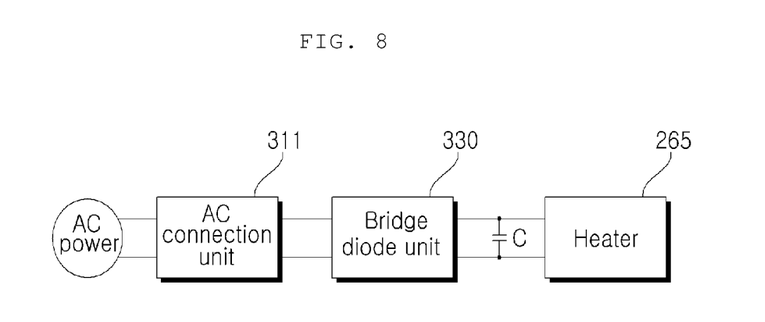

FIG. 6 is a simplified internal block diagram of a power converting apparatus according to an embodiment of the present invention, and FIG. 7 and FIG. 8 are diagrams for explaining an operation of a power converting apparatus according to an embodiment of the present invention.

The heater 265 needs to manufacture a separate heater 265 with a different resistance when the drive voltage is different due to the standard of the restriction of the heat saturation temperature, when a short occurs due to the failure of the drive relay. Therefore, it is difficult to achieve common use.

However, according to the present invention, the heater 265 may be commonly used without distinguishing the heater 265 according to the voltage regardless of the voltage of the DC terminal voltage 310V or 380V.

Referring to FIG. 6, the power converting apparatus 220 according to an embodiment of the present invention may include an input unit 310 capable of receiving an AC power and a DC power, and a bridge diode unit 330 for rectifying the AC power, so that it can be used in AC distribution environment and DC distribution environment.

Here, the bridge diode unit 330 may provide the same output irrespective of the connection polarity of the DC power.

The bridge diode unit 330 may operate as a converter when AC power is input, and as a safety apparatus to prevent a safety accident due to a reverse connection when DC power is input.

Referring to FIG. 6, the power converting apparatus 220 according to an embodiment of the present invention may include a power supply unit 300 for processing and outputting an input power.

In the past, the configuration of power supply circuit have been designed differently to be used separately for an AC electric appliance using AC power and a DC electric appliance using DC power.

However, the power supply unit 300 according to an embodiment of the present invention may be a common unit designed to be used both as an AC power supply unit and as a DC power supply unit, and may receive an AC power and a DC power, and may output the DC power.

Particularly, the heater power supply unit 360 may output the voltage supplied to the heater 265 uniformly so that the heater 265 independent of the input voltage can be commonly used.

According to an embodiment of the present invention, the DC 310V may be directly used as the driving voltage of the heater 265, and, when the DC 380V is inputted, the DC 380V may pass through the DC/DC converter 350 which reduce the voltage into 310V via the relay unit 340, so that the driving voltage of the heater 265 can be unified into DC 310V.

Accordingly, the heater 265 can be commonly used without separately manufacturing the heater 265 according to the driving voltage, so that it is possible to develop an AC/DC combined home appliance.

FIG. 7 illustrates a case where a DC power is input.

The DC connection unit 312 of the input unit 310 may receive and output the DC power when the DC power is input, and the DC connection unit 312 of the input unit 310 is schematically shown in FIG. 7.

Referring to FIGS. 6 and 7, when the DC power is input, the bridge diode unit 330 may only serve to prevent the reverse connection. Therefore, the both-end voltage of the DC terminal capacitor C detected by the DC terminal voltage detection unit S1 shall be the same as the voltage corresponding to the DC power supply. For example, when the DC 380V is input, the both-end voltage of the DC terminal capacitor C detected by the DC terminal voltage detection unit S1 may be 380V.

Referring to FIGS. 6 and 7, when the voltage detected by the DC terminal voltage detection unit S1 is 380V, the relay unit 340 may connect the output to the DC/DC converter 350.

The DC/DC converter 350 may reduce the voltage of 380V to 310V and supply the reduced voltage to the heater 265.

The heater 265 may generate heat by using 310V as the driving voltage. Accordingly, the heater 265 may be safely driven with a certain heating temperature by using an uniform input voltage, and the heater 265 may be commonly used while satisfying the heating temperature standard.

More preferably, the resistance value of the heater 265 may be designed based on the output voltage of the DC/DC converter 350.

FIG. 8 illustrates a case where an AC power is input.

The AC connection unit 311 of the input unit 310 may receive and output an AC power when the AC power is input, and the AC connection unit 311 of the input unit 310 is schematically shown in FIG. 8.

Referring to FIGS. 6 and 8, when the AC power is input, the bridge diode unit 330 may rectify the AC power, and the rectified power may be stored in the DC terminal capacitor C. For example, when the AC 220V is input, DC 310V may be stored in the DC terminal capacitor C.

Accordingly, the both-end voltage of the DC terminal capacitor C detected by the DC terminal voltage detection unit S1 shall be DC 310V. For example, when the AC 220V is input, the both-end voltage of the DC terminal capacitor C detected by the DC terminal voltage detection unit S1 may be 310V.

Referring to FIGS. 6 and 8, when the voltage detected by the DC terminal voltage detection unit S1 is 310 V, the relay unit 340 may connect the output to the heater 265.

The heater 265 may generate heat by using 310V as the driving voltage. Accordingly, the heater 265 may be safely driven with a certain heating temperature by using an uniform input voltage, and the heater 265 may be commonly used while satisfying the heating temperature standard.

Meanwhile, the DC terminal may be connected to the inverter unit 240, and a voltage conversion unit (not shown) in parallel with the power supply unit 360.

The power converting apparatus 220 may further include an inverter unit 240 for driving the motor 230, based on the power stored in the DC terminal capacitor C. For example, the inverter unit 240 may be an intelligent power module (IPM), in which a switching element (IGBT) and a diode (FRD) are connected, that converts the DC power into a three-phase AC and supplies the AC to the motor 230. In addition, the inverter unit 240 may include an inverter (not shown) for driving the motor 230 and an inverter controller (not shown) for controlling the inverter.

Meanwhile, FIG. 6 illustrates a case where the power converting apparatus 220 is used as a motor driving apparatus for supplying power to the motor 230. In this case, the power converting apparatus 220 may be referred to as a motor driving apparatus, a motor driving unit, or the like. Alternatively, the power converting apparatus 220 may convert input power and supply the converted power to a load.

Meanwhile, the power converting apparatus 220 may further include a voltage conversion unit connected to the DC terminal to supply DC power to at least one load. The voltage conversion unit may convert the DC power stored in the DC terminal capacitor C to a certain level and output the converted DC power.

The voltage conversion unit may convert the DC power stored in the DC terminal capacitor C and output the converted DC power. For example, the voltage conversion unit may include a switched mode power supply (SMPS).

In some cases, the voltage conversion unit can output the reduced voltage. The voltage conversion unit may output various voltage levels included in the driving of each unit inside the home appliance.

For example, the DC power 380V may be used for energy storage system (ESS), solar power generation, electric vehicle (EV), inverter household appliances, and the like, and the loads of 24V or less such as a video/computer equipment, an internal unit in household appliances, and the like may respond by reducing the voltage through the voltage conversion unit.

Figure 9:
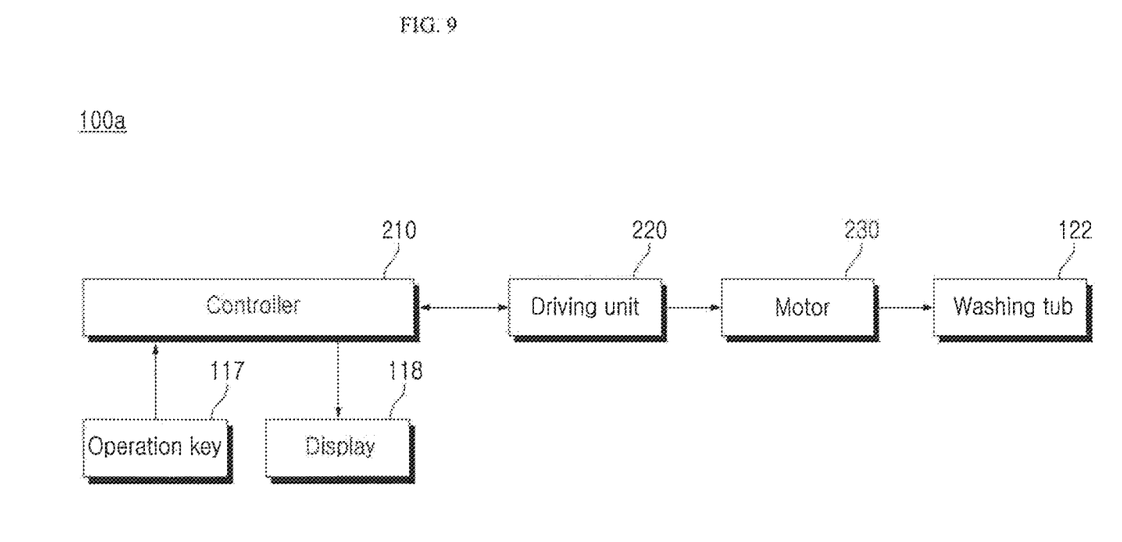
FIG. 9 is an internal block diagram of a laundry treatment apparatus which is an example of a home appliance according to an embodiment of the present invention.
Figure 10:
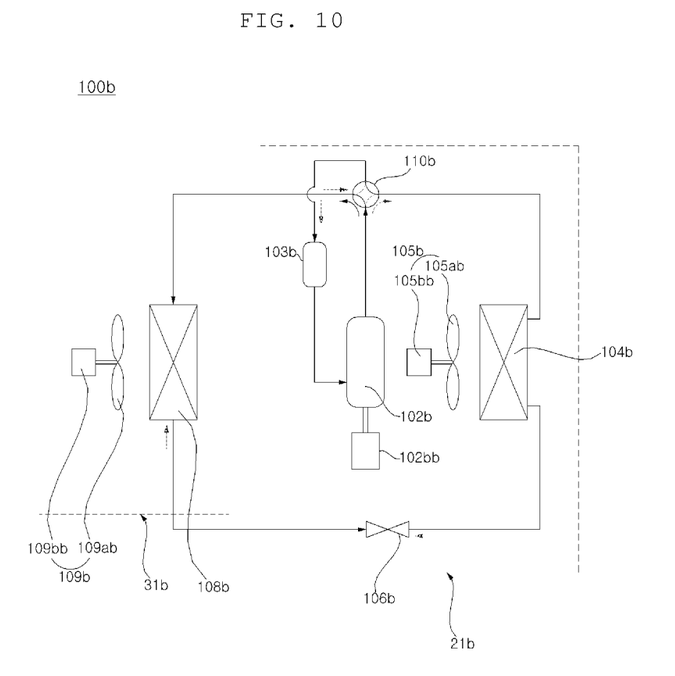
FIG. 10 is a schematic diagram illustrating an outdoor unit and an indoor unit of an air conditioner which is another example of a home appliance according to an embodiment of the present invention.
Figure 11:
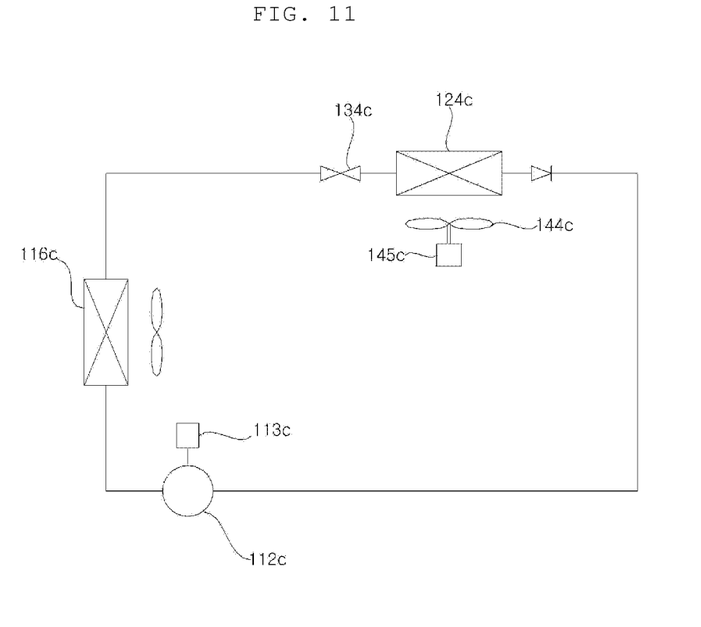
FIG. 11 is a schematic diagram illustrating a configuration of a refrigerator which is another example of a home appliance according to an embodiment of the present invention.

Meanwhile, the above mentioned power converting apparatus 220 may be applied to various electronic apparatuses. For example, it may be applied to a laundry treatment apparatus, an air conditioner, a refrigerator, a water purifier, a cleaner, a vehicle, a robot, a drone, and the like among a home appliance. FIG. 9 to FIG. 11 illustrates various examples of a home appliance to which the power converting apparatus 220 is applicable.

FIG. 9 is an internal block diagram of a laundry treatment apparatus which is an example of a home appliance according to an embodiment of the present invention.

Referring to the drawing, in a laundry treatment apparatus 100a, the driving unit 220 may be controlled by a control operation of a controller 210, and the driving unit 220 may drive the motor 230. Accordingly, a washing tub 122 may be rotated by the motor 230.

The controller 210 may receive an operation signal from an operation key 117 to perform operation. Accordingly, washing, rinsing, and dewatering may be performed.

In addition, the controller 210 may control a display 118 to display washing course, washing time, dewatering time, rinsing time, current operation state, or the like.

Meanwhile, the controller 210 may control the driving unit 220 so that the driving unit 220 controls to operate the motor 230. At this time, a position detection unit for detecting the rotor position of the motor may not be provided inside or outside the motor 230. That is, the driving unit 220 may control the motor 230 by a sensorless method.

The driving unit 220 may drive the motor 230, and may include an inverter (not shown), an inverter controller (not shown), an output current detection unit (not shown) for detecting an output current flowing to the motor 230, and an output voltage detection unit (not shown) for detecting an output voltage vo applied to the motor 230.

For example, an inverter controller (not shown) in the driving unit 220 may estimate the rotor position of the motor 230, based on the output current idc and the output voltage vo. Then, the inverter controller may control to rotate the motor 230, based on the estimated rotor position.

Specifically, the inverter controller may generate a switching control signal of a pulse width modulation (PWM) method, based on the output current idc and the output voltage vo, and output the switching control signal to an inverter (not shown). Then, an inverter (not shown) may perform a high-speed switching operation, and supply the AC power of a certain frequency to the motor 230. In addition, the motor 230 may be rotated by the AC power of a certain frequency.

Meanwhile, the driving unit 220 may correspond to the power converting apparatus (motor driving apparatus) as shown in FIG. 6.

Meanwhile, the controller 210 may detect the laundry amount, based on the output current idc flowing to the motor 230 or the like. For example, the controller 210 may detect the laundry amount, based on the current value idc of the motor 230, while the washing tub 122 rotates.

In particular, when detecting the laundry amount, the controller 210 may accurately detect the laundry amount by using a stator resistance and an inductance value of the motor measured in a motor alignment section.

Meanwhile, the controller 210 may detect the amount of eccentricity of the washing tub 122, i.e., the unbalance UB of the washing tub 122. Such eccentricity detection may be performed based on the ripple component of the output current idc flowing to the motor 230 or the rotational speed change amount of the washing tub 122.

In particular, when detecting the laundry amount, the controller 210 may accurately detect the amount of eccentricity, by using the stator resistance and the inductance value of the motor measured in the motor alignment section.

In addition, the laundry treatment apparatus 100a may include a heater for drying, boiling, and dehumidifying. In this case, the heater may be driven by the power converting apparatus as shown in FIG. 3 to FIG. 6.

FIG. 10 is a schematic diagram illustrating an outdoor unit and an indoor unit of an air conditioner which is another example of a home appliance according to an embodiment of the present invention.

Referring to the drawing, the air conditioner 100b may be roughly divided into an indoor unit 31b and an outdoor unit 21b.

The outdoor unit 21b may include a compressor 102b serving to compress a refrigerant, a compressor motor 102bb for driving the compressor, an outdoor heat exchanger 104b serving to dissipate the compressed refrigerant, an outdoor fan 105b including an outdoor fan 105ab which is disposed in one side of the outdoor heat exchanger 104b and accelerates the heat dissipation of the refrigerant and an electric motor 105bb which rotates the outdoor fan 105ab, an expansion mechanism 106b for expanding the condensed refrigerant, a cooling/heating switching valve 110b for changing the flow path of the compressed refrigerant, and an accumulator 103b for temporarily storing the gasified refrigerant to remove water and foreign substances, and then supplying a refrigerant of a certain pressure to the compressor.

The indoor unit 31b may include an indoor heat exchanger 108b which is disposed indoors and performs a cooling/heating function, and an indoor air blower 109b including an indoor fan 109ab which is disposed in one side of the indoor heat exchanger 108b and accelerates the heat dissipation of the refrigerant and an electric motor 109bb for which rotates the indoor fan 109ab.

At least one indoor heat exchanger 108b may be installed. At least one of an inverter compressor and a constant speed compressor may be used as the compressor 102b.

Further, the air conditioner 100b may be implemented by a cooler for cooling the room, or a heat pump for cooling or heating the room.

The compressor 102b in the outdoor unit 21b of FIG. 10 may be driven by a power converting apparatus (motor driving apparatus), as shown in FIG. 6, which drives a compressor motor 230b.

Alternatively, the indoor fan 109ab or the outdoor fan 105ab may be driven by a power converting apparatus (motor driving apparatus), as shown in FIG. 6, which drives the indoor fan motor 109bb and the outdoor fan motor 105bb, respectively.

In addition, the air conditioner 100b may include a heater. The heater may be installed in the outdoor unit of the air conditioner 100b to remove ice from the outdoor heat exchanger, and may be installed in the indoor unit and used for heating. In this case, the heater may be driven by the power converting apparatus as shown in FIG. 3 to FIG. 6.

FIG. 11 is a schematic diagram illustrating a configuration of a refrigerator which is another example of a home appliance according to an embodiment of the present invention.

Referring to the drawing, a refrigerator 100c may include a compressor 112c, a condenser 116c for condensing the refrigerant compressed by the compressor 112c, a freezer compartment evaporator 124c provided in a freezer compartment (not shown) to receive and evaporate the refrigerant condensed in the condenser 116c, and a freezer compartment expansion valve 134c for expanding the refrigerant supplied to the freezer compartment evaporator 124c.

Meanwhile, in the drawing, it is illustrated that a single evaporator is used, but it is also possible to a separate evaporator in each of the refrigerating compartment and the freezer compartment.

That is, the refrigerator 100c may include a refrigerating compartment evaporator (not shown) disposed in a refrigerating compartment (not shown, a three-way valve (not shown) for supplying the refrigerant condensed in the condenser 116c to the refrigerating compartment evaporator (not shown) or the freezer compartment evaporator 124c, and a refrigerating compartment expansion valve (not shown) for expanding the refrigerant supplied to the refrigerating compartment evaporator (not shown).

In addition, the refrigerator 100c may further include a gas-liquid separator (not shown) which separates the refrigerant passed through the evaporator 124c into a liquid and a gas.

In addition, the refrigerator 100c may further include a refrigerating compartment fan (not shown) and a freezer compartment fan 144c that suck cold air passed through the freezer compartment evaporator 124c, and blow the sucked cold air to the refrigerating compartment (not shown) and the freezer compartment (not shown).

Further, the refrigerator may further include a compressor driving unit 113c for driving the compressor 112c, and a refrigerating compartment fan driving unit (not shown) and a freezer compartment fan driving unit 145c that drive the refrigerating compartment fan (not shown) and the freezer compartment fan 144c respectively.

Meanwhile, referring to the drawing, since a common evaporator 124c is used for the refrigerating compartment and the freezer compartment, in this case, a damper (not shown) may be installed between the refrigerating compartment and the freezer compartment, and a fan (not shown) may forcedly blow to supply the cold air generated by a single evaporator to the freezer compartment and the refrigerating compartment.

The compressor 112c of FIG. 11 may be driven by a power converting apparatus (motor driving apparatus), as shown in FIG. 6, which drives the compressor motor.

Alternatively, the refrigerating compartment fan (not shown) or the freezer compartment fan 144c may be driven by the power converting apparatus (motor driving apparatus), as shown in FIG. 6, which drives a refrigerating compartment fan motor (not shown), and a freezer compartment fan motor (not shown).

In addition, the refrigerator 100c may be provided with a heater for defrosting, melting ice, or for a home bar. In this case, the heater may be driven by the power converting apparatus as shown in FIG. 3 to FIG. 6.

According to at least one of the embodiments of the present invention, an AC/DC combined home appliance can be provided.

According to at least one of the embodiments of the present invention, the load can be driven by automatically introducing the AC or DC power to the power supply unit. Further, by commonly using a power supply circuit to which the power is input, manufacturing cost can be reduced.

In addition, according to at least one of the embodiments of the present invention, by commonly using a heater regardless of the input power, manufacturing cost can be reduced and safety accidents due to heat generation of the heater can be prevented.

In addition, according to at least one of the embodiments of the present invention, a home appliance can be used through only a simple operation of connecting any one power plug to the home appliance and plugging it into an outlet, thereby improving usability.

In addition, according to at least one of the embodiments of the present invention, safety accidents due to the DC power polarity connection can be prevented.

In addition, according to at least one of the embodiments of the present invention, it can be used as an AC household appliance in an area where DC distribution is not spread and, even if DC distribution is spread since then, can be used as a DC household appliance without needing to replace a product.

The power converting apparatus and the home appliance having the power converting apparatus according to the present invention are not limited to the configuration and method of the embodiments described above, and the above embodiments may be implemented by selectively combining all or some of the embodiment so that various modifications can be achieved.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the following claims.

What is claimed is:

1. A power converting apparatus comprising: an input unit including an AC connection unit to receive an alternating current (AC) power and a DC connection unit to receive a direct current (DC) power; a bridge diode unit including a plurality of diodes and coupled to the input unit; a capacitor which is coupled to a DC terminal which is an output terminal of the bridge diode unit; a DC terminal voltage detection unit to detect a DC terminal voltage: a heater; and a heater power supply unit which is disposed between the capacitor and the heater to selectively supply a voltage, having a different magnitude to the DC terminal voltage, to the heater according to the DC terminal voltage, wherein the heater power supply unit: comprises: a DC/DC converter to convert the DC terminal voltage and output a converted voltage to the heater; and a relay unit to selectively supply the DC terminal voltage to the heater or connect the DC/DC converter, according to the DC terminal voltage, wherein the relay unit operates to supply the DC terminal voltage to the heater when the DC terminal voltage is a first voltage, and supply the DC terminal voltage to the DC/DC converter when the DC terminal voltage is a second voltage higher than the first voltage, wherein the heater has a maximum efficiency when the DC terminal voltage has the same magnitude as a voltage generated by rectifying the AC power.

2. The power converting apparatus of claim 1, wherein the DC/DC converter reduces and outputs an input voltage.

3. The power converting apparatus of claim 1, wherein the heater is at the maximum efficiency when the DC terminal voltage is equal to the first voltage.

4. The power converting apparatus of claim 1, wherein the relay unit comprises:
 an input terminal coupled to the DC terminal;
 a first output terminal which is coupled to the DC/DC converter;
 a second output terminal which is coupled to the heater; and
 a relay to switch between the first output terminal and the second output terminal.

5. The power converting apparatus of claim 1, wherein the bridge diode unit operates such that diodes of the plurality of diodes form a circuit path on according to a polarity of the DC power received in the input unit.

6. The power converting apparatus of claim 1, wherein the bridge diode unit converts the AC power received through the AC connection unit to DC power, and outputs the DC power to the DC terminal.

7. The power converting apparatus of claim 1, comprising a noise filter disposed between the input unit and the bridge diode unit.

8. The power converting apparatus of claim 1, wherein the AC connection unit is coupled to an AC plug and the DC connection unit is coupled to a DC plug, and
 the DC plug comprises an arc extinction device.

9. The power converting apparatus of claim 1, wherein the input unit comprises:
 an AC input detection unit to sense an input of the AC power; and
 a DC input detection unit to sense an input of the DC power.

10. The power converting apparatus of claim 9, comprising a relay to interrupt a connection between the AC connection unit and the bridge diode unit when the DC input detection unit detects the input of the DC power.

11. The home appliance of claim 1, wherein the input unit comprises:
 an AC input detection unit to sense an input of the AC power; and
 a DC input detection unit to sense an input of the DC power.

12. The home appliance of claim 11, comprising a relay, wherein the controller controls the relay to interrupt a connection between the AC connection unit and the bridge diode unit when the DC input detection unit detects the input of the DC power.

13. A home appliance comprising: an input unit including an AC connection unit to receive an alternating current (AC) power and a DC connection unit to receive a direct current (DC) power; a bridge diode unit including a plurality of diodes and coupled to the input unit; a capacitor which is coupled to a DC terminal which is an output terminal of the bridge diode unit; a DC terminal voltage detection unit to detect a voltage of the DC terminal; a controller; a heater; and a heater power supply unit which is disposed between the capacitor and the heater, and the controller controls the heater power supply unit to selectively supply a voltage having a different magnitude to the voltage of the DC terminal to the heater according to the voltage of the DC terminal, wherein the heater power supply unit comprises: a DC/DC converter to convert the voltage of the DC terminal and output a converted voltage to the heater; and a relay unit, wherein the controller controls the relay unit to selectively supply the voltage of the DC terminal to the heater or connect the DC/DC converter according to the voltage of the DC terminal, wherein the relay unit operates to supply the voltage of the DC terminal to the heater when the voltage of the DC terminal is a first voltage, and supply the voltage of the DC terminal to the DC/DC converter when the voltage of the DC terminal is a second voltage higher than the first voltage, wherein the heater has a maximum efficiency when the DC terminal voltage has the same magnitude as a voltage generated by rectifying the AC power.

14. The home appliance of claim 13, wherein the bridge diode unit operates such that diodes of the plurality of diodes form a circuit path according to a polarity of the DC power received in the input unit.

15. The home appliance of claim 13, wherein the bridge diode unit converts the AC power received through the AC connection unit to DC power, which outputs the DC power to the DC terminal.

16. The home appliance of claim 13, comprising:
 an inverter unit coupled to the DC terminal; and
 a motor coupled to the inverter unit.

* * * * *